United States Patent [19]

Tabara

[11] Patent Number: 5,670,422
[45] Date of Patent: Sep. 23, 1997

[54] METHOD OF FORMING AN INTERCONNECTION WITH METAL PLUG AND REDUCED STEP

[75] Inventor: Suguru Tabara, Hamamatsu, Japan

[73] Assignee: Yamaha Corporation, Japan

[21] Appl. No.: 651,880

[22] Filed: May 21, 1996

[30] Foreign Application Priority Data

May 24, 1995 [JP] Japan ................................. 7-149457

[51] Int. Cl.$^6$ ................................................ H01L 21/283
[52] U.S. Cl. ...................... 437/192; 437/190; 437/195
[58] Field of Search ................................. 437/192, 195, 437/189, 194, 228 I, 245, 246

[56] References Cited

U.S. PATENT DOCUMENTS

| 4,851,365 | 7/1989 | Jeuch | 437/190 |
|---|---|---|---|
| 4,926,237 | 5/1990 | Sun et al. | 257/751 |
| 4,988,423 | 1/1991 | Yamamoto et al. | 437/192 |
| 5,106,781 | 4/1992 | Penning De Vries | 437/192 |
| 5,264,391 | 11/1993 | Son et al. | 437/195 |
| 5,279,990 | 1/1994 | Sun et al. | 437/195 |
| 5,330,934 | 7/1994 | Shibata et al. | 437/192 |
| 5,407,861 | 4/1995 | Marangon et al. | 437/192 |
| 5,529,956 | 6/1996 | Morishita | 437/195 |
| 5,571,751 | 11/1996 | Chung | 437/195 |

FOREIGN PATENT DOCUMENTS

| 62-291948 | 12/1987 | Japan . | |
|---|---|---|---|
| 6232124 | 8/1994 | Japan | 437/195 |

OTHER PUBLICATIONS

M. Sato, et al., "Suppression of Microloading Effect by Low-Temperature SiO$_2$ Etching", Jpn. J. Appl. Phys., vol. 31 (1992), pp. 4370–4375.

Primary Examiner—Michael Trinh
Attorney, Agent, or Firm—Ostrolenk, Faber, Gerb & Soffen, LLP

[57] ABSTRACT

After an interconnection layer of Al alloy or the like is formed on an insulating film covering the surface of a substrate, a contact hole is formed through a laminate of the insulating film and connection layer at the position corresponding to a connection part of the substrate. After the interconnection layer is patterned, an adhesion layer of TiN or the like is formed on the insulating film, covering a left portion of the interconnection layer and the inner surface of the contact hole. A conductive layer of W or the like is formed on the adhesion layer by blanket CVD, burying the contact hole. Thereafter, the conductive layer and adhesion layer are etched back to form an interconnection 22 including the left portion of the interconnection layer, left portions of the adhesion layer, and left portions of the conductive layer. A step of the interconnection can be relieved by leaving the portions of the conductive layer on the side walls of the interconnection.

15 Claims, 12 Drawing Sheets

METHOD OF FORMING AN INTERCONNECTION WITH METAL PLUG AND REDUCED STEP

BACKGROUND OF THE INVENTION

1. Field of the Invention

The present invention relates to interconnections in which metal plugs such as W (tungsten) are buried in contact holes by blanket CVD (chemical vapor deposition), and a manufacture method thereof. More particularly, the invention relates to interconnections with metal plugs and a manufacture method thereof, capable of relieving steps of interconnections with a less number of processes.

2. Description of the Related Art

A conventional interconnection forming method using blanket tungsten CVD such as illustrated in FIGS. 16 to 20 is known.

At a process illustrated in FIG. 16, after an n-type impurity doped region 12 to be connected to an interconnection is formed in the surface region of a p-type semiconductor substrate 10 made of such as Si, an insulating film 14 is formed over the substrate, covering the region 12. A contact hole is formed in insulating film 14 at the position corresponding to the region 12, and thereafter a stacked adhesion layer 15 is formed on the insulating film 14, covering the inner surface of the contact hole, the stacked adhesion layer 15 being a laminate of a Ti layer and a TiN or TiON layer formed thereon. Thereafter, a W layer 17 is formed on the adhesion layer 15 by blanket CVD, burying the contact hole. The adhesion layer 15 improves adhesion between the W layer 17 and the insulating film 14, and also functions as a barrier layer for preventing a reaction of the W layer 17 with substrate Si.

Next, at a process illustrated in FIG. 17, the W layer is etched back until the adhesion layer 15 on the top surface of the insulating film 14 is exposed, and a portion of the W layer 17 is left unetched in the contact hole as a plug 17A.

At a process illustrated in FIG. 18, an Al alloy layer 19 is formed over the substrate, covering the plug 17A and adhesion layer 15.

At a process illustrated in FIG. 19, an antireflection layer 21 made of, for example, TiN or TiON, is formed on the Al Alloy layer 19. The antireflection layer 21 suppresses light reflection from the Al alloy layer 19 at a photolithography process for interconnection patterning. Therefore, a precision of pattern transfer to a resist layer can be improved.

Next, at a process illustrated in FIG. 20, a laminate of the adhesion layer 15, Al alloy layer 19, and antireflection layer 21 is patterned to form an interconnection 23 having a desired pattern. The interconnection 23 is constituted by a remaining portion 15A of the adhesion layer 15, the plug 17A, a remaining portion 19A of the Al alloy layer 19, and a remaining portion 21A of the antireflection layer 21.

The above conventional technique is, however, associated with the following problems (a) to (c).

(a) FIG. 9A shows interconnection layers 23A and 23B formed by a method similar to the one for forming the interconnection 23 shown in FIG. 20. The interconnection layers 23A and 23B are then covered with an interlayer insulating film 25 formed by CVD. Since the steps at the side walls of the interconnection layers 23A and 23B are sharp, overhang portions P are likely to be formed on the insulating film 25.

A technique of relieving the steps of interconnections has been proposed in which side spacers (side walls) are formed on the side walls of interconnections. With this technique, after an insulating film is formed covering an interconnection layer, the insulating film is anisotropically etched back to leave side spacers on the side walls of the interconnection layer. Although this technique is effective for preventing generation of overhangs, the number of processes increases if it is applied to the conventional technique illustrated in FIGS. 16 to 20.

(b) If the interconnection layers 23A and 23B are made of Al or Al alloy, hillocks (surface mounds) may be formed by heat treatments or the like after forming the interconnection layers, and short-circuits to adjacent interconnection layers may occur.

A technique of preventing such hillocks has been proposed in which a W film is formed covering the upper surface and side wall surfaces of an interconnection layer by CVD (e.g., refer to Japanese Patent Laid-open Publication No. 62-291948). Although this technique is effective for preventing generation of hillocks, the number of processes increases if it is applied to the conventional technique illustrated in FIGS. 16 to 20.

(c) The three-layer sandwich structure of Ti (or Ti alloy) /Al (or Al alloy)/Ti (or Ti alloy) is likely to generate corrosion after the interconnection etching.

SUMMARY OF THE INVENTION

An object of the present invention is to provide an interconnection structure capable of relieving the steps of interconnections.

Another object of the present invention is to provide a method of manufacturing an interconnection structure capable of relieving the steps of interconnections.

According to one aspect of the present invention, there is provided a method of forming an interconnection, comprising the steps of: forming an insulating film covering a surface of a substrate having a region to be connected to an interconnection; forming an interconnection layer on the insulating film; forming a connection hole through a laminate of the interconnection layer and the insulating film, the connection hole exposing the connection region; patterning the interconnection layer to have a desired interconnection pattern and leave a portion of the interconnection layer on the insulating film at least at a peripheral area around the connection hole; forming a conductive adhesion layer on the insulating film, the adhesion layer covering the left portion of the interconnection layer and the inner surface of the connection hole; and forming a conductive layer burying the connection hole and etching back the conductive layer, wherein a portion of the conductive layer is left on an outer side wall of the portion of the interconnection layer left on the insulating film at a peripheral area around the connection hole, so as to relieve a step of the left portion of the interconnection layer.

At the step of etching back the conductive layer (and adhesion layer), the portion of the conductive layer is left in the connection hole as a conductive plug, and also left on the outer side walls of the left portions of the interconnection layer to relieve steps. Accordingly, the interconnection structure has the conductive plug burying the connection hole and a step relieving part on the side walls of the interconnection. The number of processes for forming an interconnection is almost equal to that of the conventional technique.

If the interconnection layer includes an Al or Al alloy layer, the outer side walls of the left portions of the interconnection layer can be covered with the left portions of the conductive layer of W or the like. Therefore, the generation of hillocks can be suppressed.

According to another aspect of the present invention, there is provided a method of forming an interconnection, comprising the steps of: forming an insulating film covering a surface of a substrate having a region to be connected to an interconnection; forming an interconnection layer on the insulating film; forming an antireflection layer on the interconnection layer; forming a connection hole through a laminate of the antireflection layer, the interconnection layer, and the insulating film, by photolithography and selective etching, the connection hole exposing the connection region; patterning a laminate of the interconnection layer and the antireflection layer to leave a portion of the laminate on the insulating film at least at a peripheral area around the connection hole, by photolithography and selective etching; forming a conductive adhesion layer on the insulating film, the adhesion layer covering the left portion of the laminate and the inner surface of the connection hole; and forming a conductive layer burying the connection hole and etching back the conductive layer, wherein a portion of the conductive layer is left on an outer side wall of the portion of the laminate left on the insulating film at a peripheral area around the connection hole, so as to relieve a step of the left portion of the laminate.

It is possible to form an interconnection having a conductive plug and a step relieving part with a less number of processes. The generation of hillocks can also be suppressed. Since the antireflection layer is formed prior to interconnection patterning, the patterning precision can be improved. If the interconnection layer includes an Al or Al alloy layer, the upper surface of the left portion of the interconnection is also covered with the left portion of the antireflection layer so that the generation of hillocks can be further suppressed. Furthermore, since the laminate to be etched for interconnection patterning has a two-layer structure including, for example, a Ti (alloy) layer and an Al (alloy) layer, corrosion is hard to be generated after interconnection etching, as compared to a three-layer structure including a Ti alloy layer, an Al alloy layer, and a Ti alloy.

As described above, after the interconnection layer of Al, Al alloy, or the like is formed with a connection hole and patterned, the conductive layer such as of W or the like is formed and etched back. Accordingly, it is possible to easily form an interconnection having a conductive plug and a step relieving part, the interconnection being capable of suppressing the generation of hillocks.

With the formation of the antireflection layer prior to interconnection patterning, it is possible to improve a patterning precision, further suppress the generation of hillocks, and improve the reliability of interconnections because of the suppressed generation of corrosion.

DETAILED DESCRIPTION OF THE PREFERRED EMBODIMENTS

FIGS. 1, 2, 3A, 4 to 7, and 8A to 8C illustrate a method of forming an interconnection according to an embodiment of the invention. The processes (1) to (8) corresponding to these drawings will be described in this order.

Figure 1:
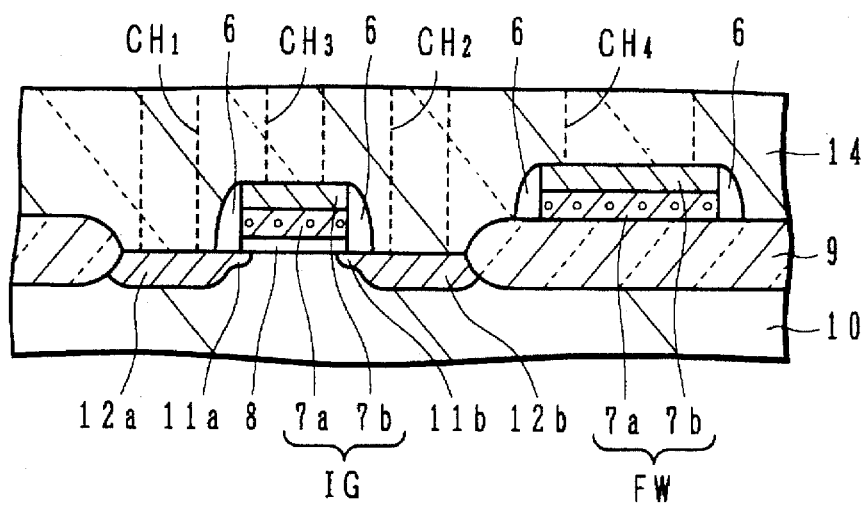
FIGS. 1, 2, 3A, 4A to 7, and 8A and 8B are cross sectional views of a substrate illustrating main processes of forming an interconnection according to an embodiment of the invention.

(1) As shown in FIG. 1, in the surface region of a p-type semiconductor substrate 10 made of Si, a pattern of a field oxide film 9 is formed by local oxidation of silicon (LOCOS). An active region is surrounded by the field oxide film 9.

A thin gate oxide film 8 is formed on the surface of the active region by thermal oxidation. On this thin gate oxide film 8, a polycrystalline silicon layer 7a and a silicide layer 7b such as $WSi_2$ are formed. This polycide structure of the layers 7a and 7b is patterned to form an insulated gate electrode IG. At this time, an interconnection or wiring pattern FW is formed on the field oxide film 9. By using the gate electrode and field oxide film as a mask, n-type impurities are implanted to form impurity doped regions 11a and 11b of lightly doped drain (LDD) structure.

A silicon oxide film is deposited over the substrate surface by chemical vapor deposition (CVD), and anisotropically etched to leave spacers (side walls) 6 on the side walls of the gate electrode and also on the side walls of the interconnection FW. Thereafter, n-type impurities are again implanted to form n-type source/drain regions 12a and 12b of high impurity concentration.

In the above manner, the insulated gate electrode IG over the active region and the interconnection FW on the field oxide film 9 are formed.

Thereafter, a first interlayer insulating film 14 made of boro-phospho-silicate-glass (BPSG) is formed over the substrate surface. The substrate is heated to fellow the BPSG film 14 and planarize the surface thereof. The first interlayer insulating film may also be formed of silicon oxide and silicon nitride.

Contact holes CH1 to CH4 are formed at a later process to be described later in the first interlayer insulating film 14, reaching the source/drain regions 12a and 12b, gate electrode 7a, 7b, and interconnection 7a, 7b. The contact hole CH4 for the interconnection on the field oxide has a larger diameter than the contact holes CH1 to CH3 for the source/drain regions and gate electrode of a MOS transistor.

In the following, for the purpose of simplicity, the drawings which shows only the peripheral area of the contact hole for a source/drain region, are used.

Figure 2:
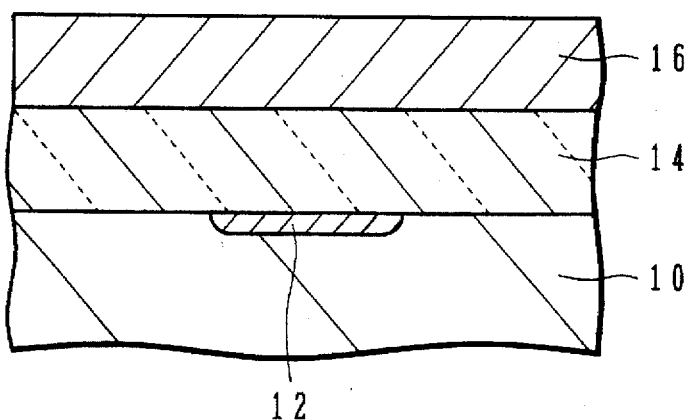

(2) As shown in FIG. 2, an Al alloy layer 16 as a main interconnection layer is formed on the insulating film 14 by sputtering under the following conditions:

A DC magnetron sputtering system is used;

Pressure: 1 to 3 mTorr;

Gas Flow Rate: Ar=50 to 150 sccm;

Power: 6 to 10 kW; and

Substrate Temperature: 100° to 200° C.

If necessary, an antireflection layer such as TiN and TiON may be deposited on the Al alloy layer 16. An Al layer may be used instead of the Al alloy layer 16.

Al and Al alloy have a property that resistance can be easily lowered as compared to other metals having the same cross sectional area. However, other metals may by used, including refractory metals such as W, Mo, Ti, and Ta, silicide of these refractory metals, and Cu.

Figure 3A:
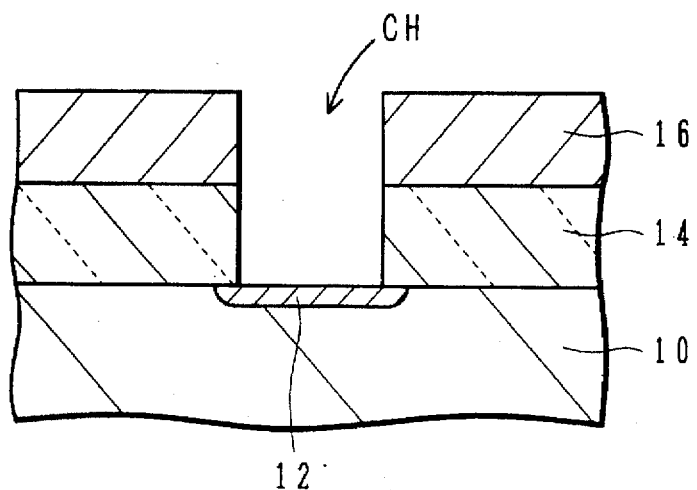

(3) As shown in FIG. 3A, a contact hole CH is formed through a laminate of the insulating film 14 and Al alloy layer 16 by photolithography and dry etching. At the dry etching process, a resist layer (not shown) is used as a mask, chlorine containing gas (e.g., $Cl_2+BCl_3$) is used for etching the Al alloy layer 16, and fluorine containing gas (e.g., $CF_4+CHF_3+Ar$) is used for etching the insulating film 14. For etching Al alloy, an inductively coupled plasma etcher such as shown in FIG. 3B is used.

Figure 3B:
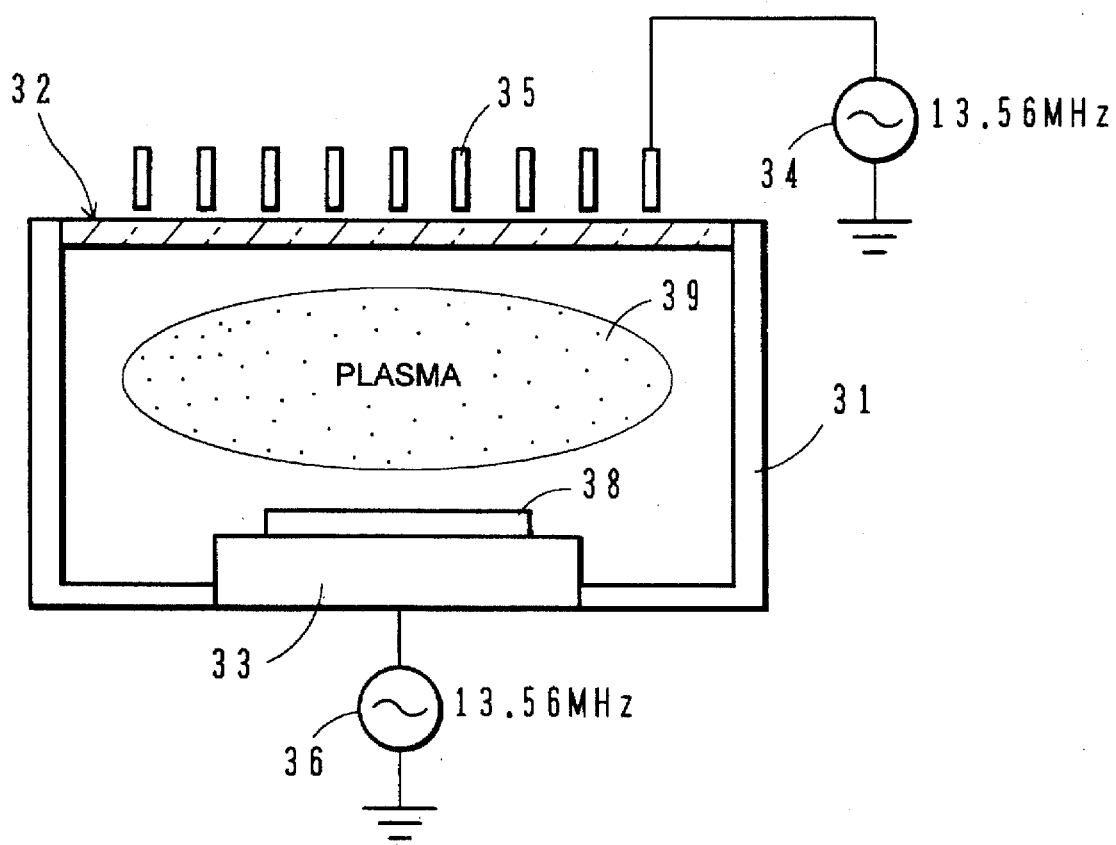
FIG. 3B is a schematic cross sectional view of an inductively coupled plasma etcher.

In FIG. 3B, a vacuum chamber 31 includes a dielectric upper plate 32 made of a dielectric material and a bottom electrode 33 made of a conductive material. Above (out side of) the dielectric upper plate 32, an inductive coil 35 is disposed and connected to an RF source (13.56 MHz) 34. The bottom electrode 33 is connected to another RF source (13.56 MHz) 36, and on (inside of) the bottom electrode 33 a wafer 38 is placed. As gas is introduced into the vacuum chamber 31 and a main RF power and a bias RF power are supplied from the RF sources 34 and 36 to the inductive coil 35 and bottom electrode 33, plasma 39 is generated at the region over the wafer 38.

The other conditions are selected, for example, as follows:
Pressure: 5 to 15 mTorr;
Gas Flow Rate: $Cl_2/BCl_3$=30 to 60/30 to 60 sccm;
Source Power: 300 to 450 W;
Bias Power: 100 to 150 W; and
Bottom Electrode Temperature: 20° to 50° C.

For example, the conditions of etching the insulating film such as $SiO_2$ are selected as follows:
A magnetron reactive ion etching system is used;
Pressure: 160 mTorr;
Gas Flow Rate: $CF_4/CHF_3/Ar$=5/3/60 sccm;
RF Power: 700 W; and
Magnetic Flux Density: 30 gauss.

Thereafter, ashing is performed using gas containing mainly oxygen and then a cleaning process is performed using organic solvent, to thereby remove the resist layer.

The contact hole may also be formed by another method. That is, a first contact hole is formed through the Al alloy layer 16 by selective etching, using the resist layer as a mask, and thereafter a second contact hole is formed through the insulating film 14 by selective etching, using the Al alloy pattern 16 as a mask. This method forms a contact hole CH by the first and second contact holes.

Because the etching mask is the conductive Al alloy layer 16, the etching rate at a small opening can be suppressed from being lowered by charge-up of the mask (microloading effect) (e.g., refer to M. Sato, et al.: Jpn. J. Appl. Phys. Vol. 31 (1992) Part 1. No. 12B).

Figure 4A:
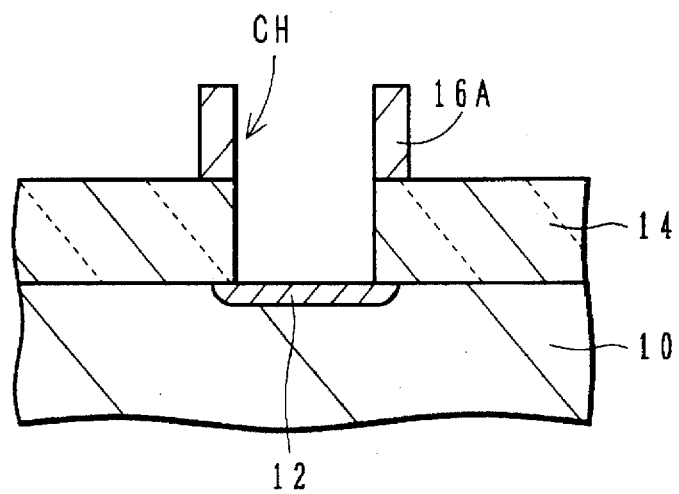
Figure 4B:
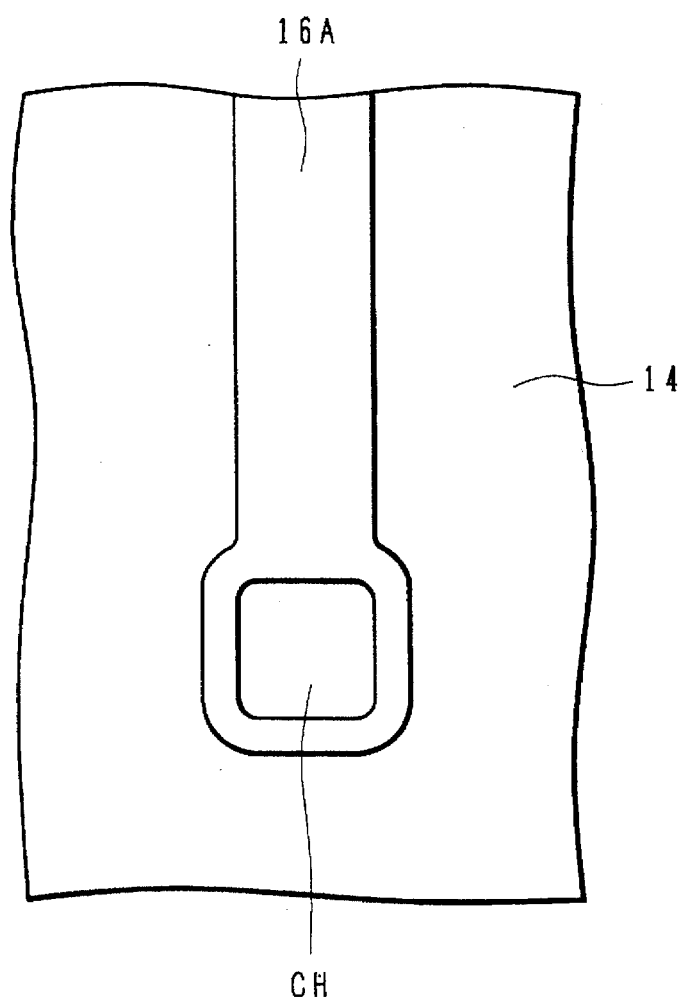

(4) As shown in FIG. 4A, after a resist pattern (not shown) having a shape corresponding to a desired interconnection pattern is formed over the substrate through photolithography, the Al alloy layer 16 is patterned through selective dry etching, using this resist pattern as a mask, to leave a portion 16A of the Al alloy layer 16, the portion 16A including a looped area of a desired width around the upper edge of the contact hole CH and a connection part extending therefrom. FIG. 4B shows a plan pattern of the interconnection 16A. For the etching process, chlorine containing gas (e.g., $Cl_2+BCl_3$) is used. After etching, the resist layer is removed in a similar manner as described above.

The inner side wall of the portion 16A of the Al alloy layer 16 is flush with the inner side wall of the contact hole CH formed in the insulating film 14. The inner side wall is a wall facing the contact hole CH. An outer side wall is defined as a wall remote from the contact hole CH.

Figure 5:
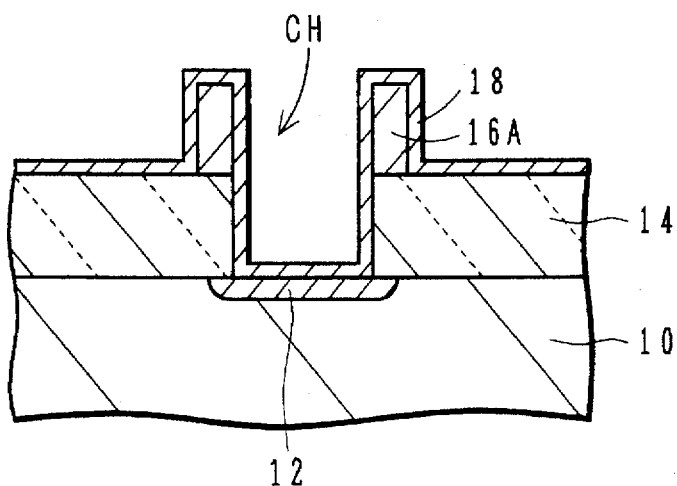

(5) As shown in FIG. 5, a TiN layer 18 is formed on the remaining Al alloy layer 18 by CVD or sputtering, covering the inner surface of the contact hole CH and the remaining portion 16A of the Al alloy layer 16. The TiN (or TiON) layer 18 serves as both a barrier layer and an adhesion layer.

For example, the conditions of forming the Ti(O)N layer are selected as follows:
A DC magnetron sputtering system is used;
Gas: $N_2$ ($O_2$ is mixed for TiON);
Pressure: 5 to 10 mTorr;
Gas Flow Rate: $N_2$ (+$O_2$)=50 to 100 sccm ($O_2$=0 to 10%);
Power: 6 to 10 kW;
Substrate Temperature: 100° to 200° C.; and
Film Thickness: 50 to 150 nm.

A Ti layer may be formed under the TiN layer 18. Instead of the TiN (or TiON) layer 18, other layers such as a TiW layer and WSi layer may be used.

The TiN layer 18 is formed on the remaining portion 16a of the aluminum alloy 16 along the inner and outer side walls of the remaining portion 16A. The side wall of the TiN layer 18 on the contact hole side is conformal to the inner side walls of the contact hole CH formed in the insulating film 14 and of the remaining portion 16A of the aluminum alloy layer 16. Also the outer side wall of the TiN layer 18 on the remaining portion 16A is conformal to the outer side wall of the remaining portion 16A. The flat portion of the TiN layer 18 extends outwards from the lower end of the outer side wall of the remaining portion 16A of the aluminum alloy layer 16.

Figure 6:
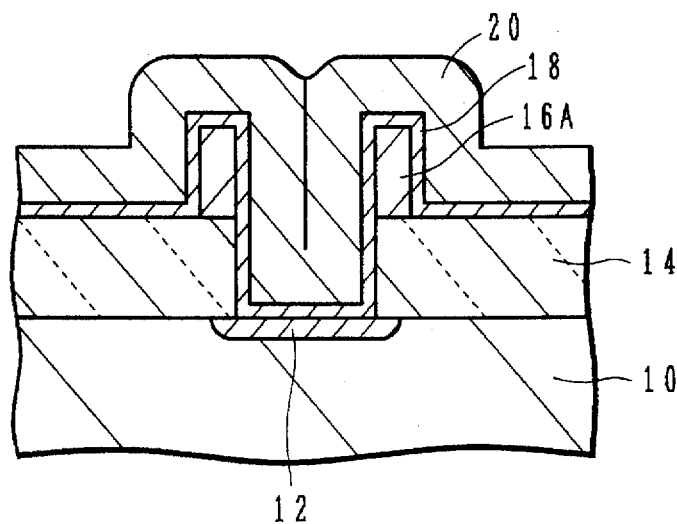

(6) As shown in FIG. 6, a conformal W layer 20 is formed on the TiN layer 18 by blanket CVD, burying the contact hole CH.

For example, the conditions of forming the W layer are selected as follows:
After growth nuclei are formed by a nucleation process, the W film is formed through thermal CVD under the conditions of:
Gas: $WF_6+H_2+N_2+Ar$:
Pressure: 50 to 100 mTorr;
Wafer Temperature: 450° C.;
Gas Flow Rate: $WF_6/H_2/N_2/Ar$=60 to 80/400 to 500/50 50 to 150/2000 sccm.

Figure 7:
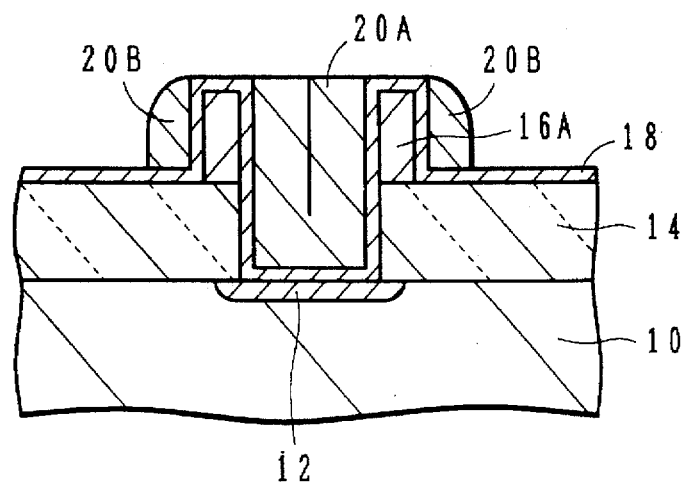

(7) As shown in FIG. 7, the W layer 20 is etched back until the TiN layer 18 on the top flat surface of the Al alloy layer 16 and of the insulating layer 14 is exposed, by using plasma of gas containing mainly chlorine containing gas (e.g., $Cl_2+O_2$, $Cl_2+N_2$, $Cl_2+SF_6$, $Cl_2$) or gas mainly containing fluorine gas (e.g., $SF_6$, $NF_3$). A first portion 20A of the W layer 20 is left unetched in the contact hole CH, and a second portion 20B of the W layer 20 is left unetched on the outer side wall of the remaining portion 16A of the Al alloy layer 16.

For example, the W etch-back conditions are selected as follows:
Etch-back is performed by an inductively coupled plasma etcher such as shown in FIG. 3B;
Pressure: 5 to 20 mTorr;
Gas: $SF_6/N_2$;
Flow Rate Ratio: $SF_6/N_2$=0.8 to 1.2 total flow rate 100 to 300 sccm:
Source Power: 600 to 700 W;

Bias Power: 60 to 100 W; and

Bottom Electrode Temperature: 20° to 30° C.

Figure 8A:
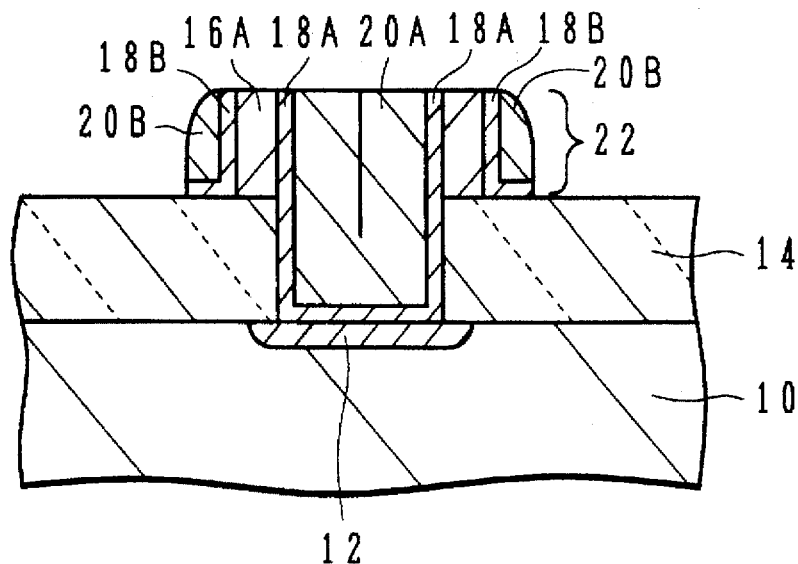

(8) As shown in FIG. 8A, the TiN layer 18 and the W remaining portion 20B are anisotropically etched, using plasma of chlorine containing gas, until the insulating film 14 is exposed, while leaving the first portion 18A of the TiN layer 18 in the contact hole CH and the second portion 18B of the TiN layer 18 or the side wall of the remaining portion 16A of the Al alloy layer 16.

Figure 8B:
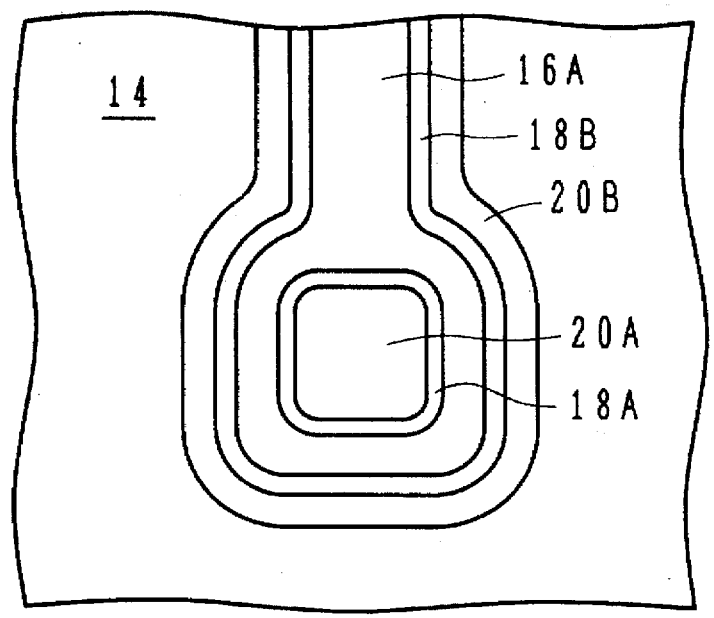

FIG. 8B is a plan view of the substrate. The W remaining portion 20B having a gently changing slope encircles the whole periphery of the interconnection. The outer periphery of the TiN layer 18B has the same shape as the outer periphery of the W remaining portion 20B.

For the etching process, in addition to the gas containing mainly chlorine used at the process illustrated in FIG. 7, $Cl_2+BCl_3$ may be used. The processes illustrated in FIGS. 7, 8A, and 8B can be performed sequentially by the same etching system or in the same etching chamber.

The interconnection of the embodiment shown in FIGS. 1, 2, 3A, 4A to 7, and 8A and 8B is constituted by: the remaining portion 16A of the Al alloy layer 16 left around the peripheral area of the contact hole CH; the first remaining portions 18A and 20A of the TiN layer 18 and W layer 20 left as the conductive plug burying the contact hole CH; and the second remaining portions 18B and 20B of the TiN layer 18 and W layer 20 left as a step relieving portion on the side wall of the remaining portion 16A of the Al alloy layer 16. The number of processes for forming such an interconnection is almost equal to the conventional technique illustrated in FIGS. 16 to 20, even if an antireflection layer is formed on the Al alloy layer 16 at the process of FIG. 2.

Figure 9A:
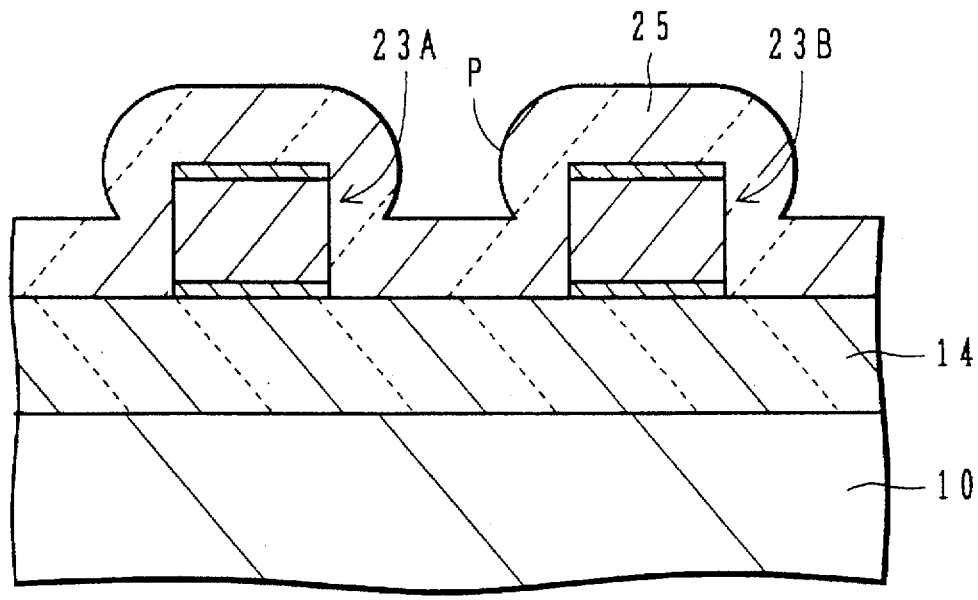
FIGS. 9A and 9B are cross sectional views of a substrate illustrating interconnection structures according to a conventional technique and to the embodiment of the present invention.
Figure 9B:
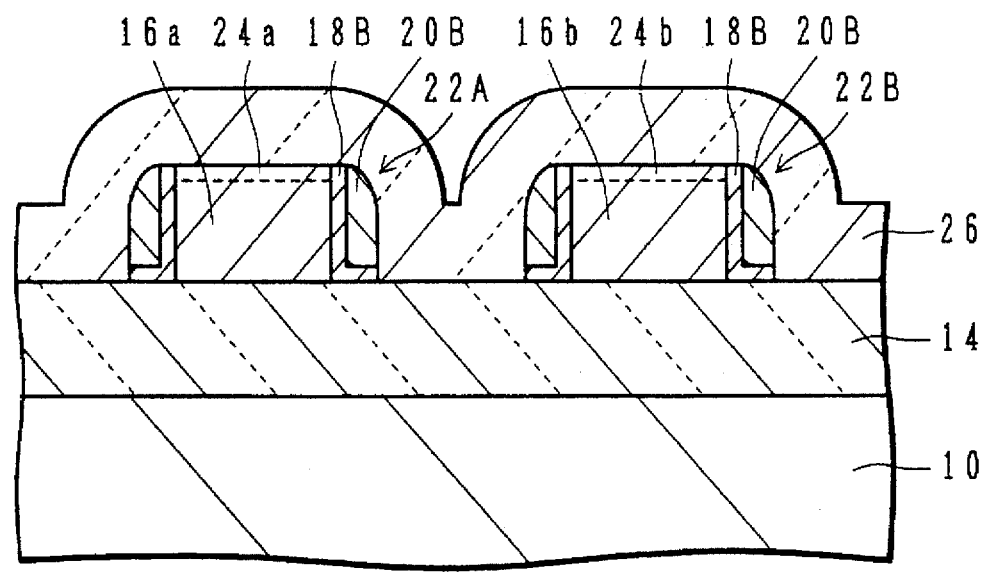

The interconnection structure shown in FIGS. 8A and 8B has the step relieving part at the interconnection 22 made of the remaining portions 18B and 20B. As shown in FIG. 9B, an interlayer insulating film 26 made of, for example, silicon dioxide, covering interconnection layers 22A and 22B and formed by CVD has no overhang such as shown in FIG. 9A, and has good step coverage. In FIG. 9B, the interconnection layers 22A and 22B are formed in a manner similar to the one for forming the interconnection 22 shown in FIG. 8A, and Al alloy layers 16a and 16b are constituted by the remaining portions of an Al alloy layer similar to the layer 16 shown in FIGS. 2 and 3A.

All the interconnection layers 22A, and 22B are covered with the two layers formed by the remaining portion 18B of the adhesion layer such as TiN and the remaining portion 20B of the conductive layer such as W. Therefore, it is also advantageous in that the generation of hillocks can be suppressed. The upper surfaces of the Al alloy layers 16a and 16b are exposed in the direction normal to the substrate (the surfaces are thereafter covered with an interlayer insulating film 26). Even if hillocks are generated, they extend in the direction normal to the substrate so that short-circuits of interconnections are hard to occur.

FIGS. 10 to 15 illustrate an interconnection forming method according to another embodiment of the invention. A different point of this embodiment from the embodiment shown in FIGS. 1, 2, 3A, 4A to 7, and 8A and 8B is an addition of a process of forming an antireflection layer prior to interconnection patterning, in which a remaining portion of the antireflection layer covers the upper surface of the remaining portion of an interconnection layer.

Figure 10:
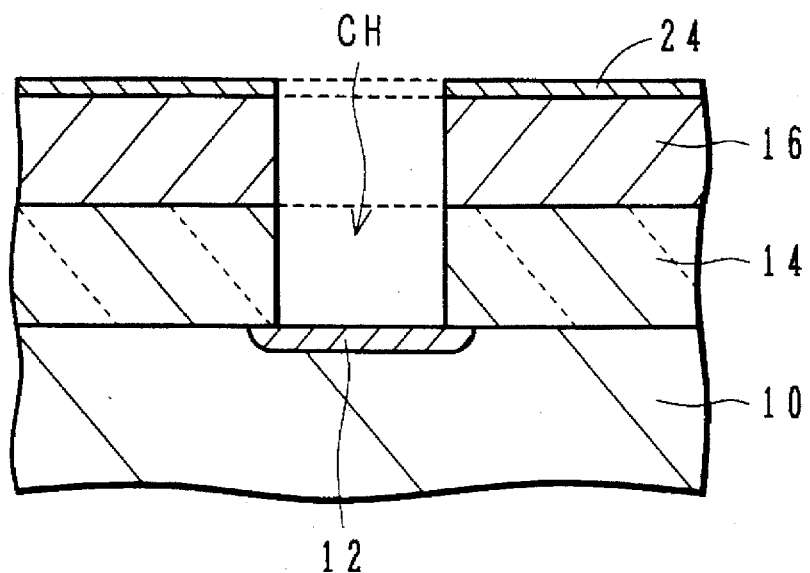
FIGS. 10 to 15 are cross sectional views of a substrate illustrating main processes of forming an interconnection according to another embodiment of the invention.

As shown in FIG. 10, similar to the processes illustrated in FIGS. 1 and 2, an impurity doped region 12 is formed in the surface layer of a substrate 10, and an insulating film 14 and an Al alloy layer 16 are deposited on the surface of the substrate 10 in this order. Thereafter, a TiN (or TiON) layer 24, as an antireflection layer, is formed on the Al alloy layer 16. Similar to the process illustrated in FIG. 3, a contact hole CH is formed through the TiN layer 24, Al alloy layer 16, and insulating layer 14, the contact hole reaching the impurity doped region 12 to be connected to an interconnection.

Figure 11:
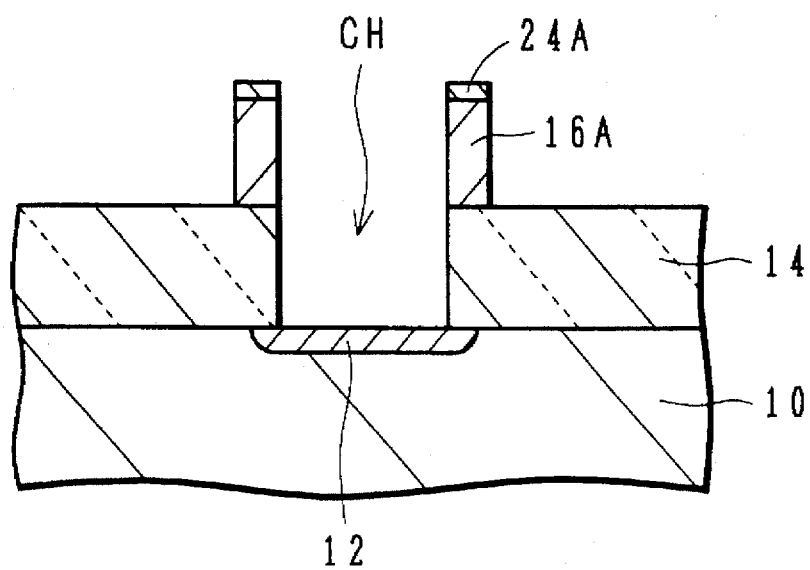

As shown in FIG. 11, similar to the process illustrated in FIG. 4, a laminate of the Al alloy layer 16 and TiN layer 24 is patterned in conformity with a desired interconnection pattern to leave at least a portion 16A of the Al alloy layer 16 and a portion 24A of the TiN layer 24 on the peripheral area around the contact hole.

Figure 12:
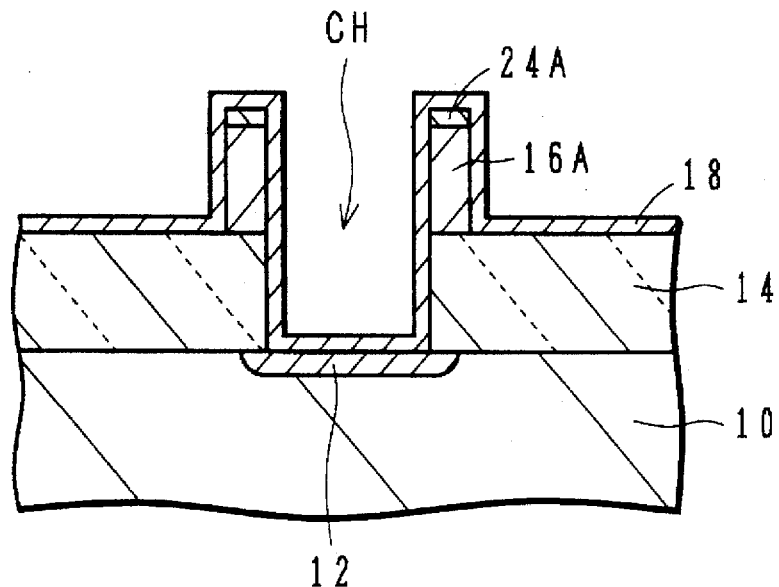

As shown in FIG. 12, similar to the process illustrated in FIG. 5, a TiN layer 18 serving as both a barrier layer and an adhesion layer is formed on the insulating film 14, covering the remaining portion 16A of the Al alloy layer 16, the remaining portion 24A of the TiN layer 24, and the inner surface of the contact hole CH.

Figure 13:
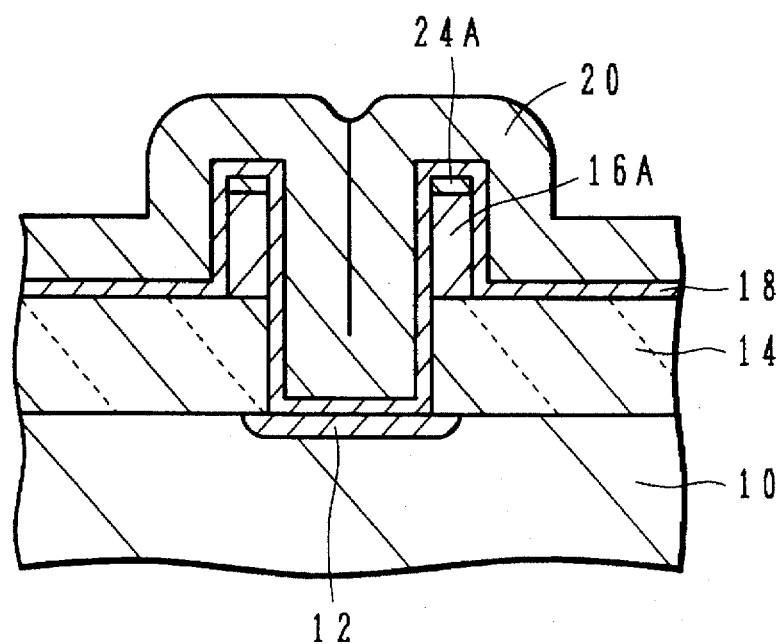
Figure 14:
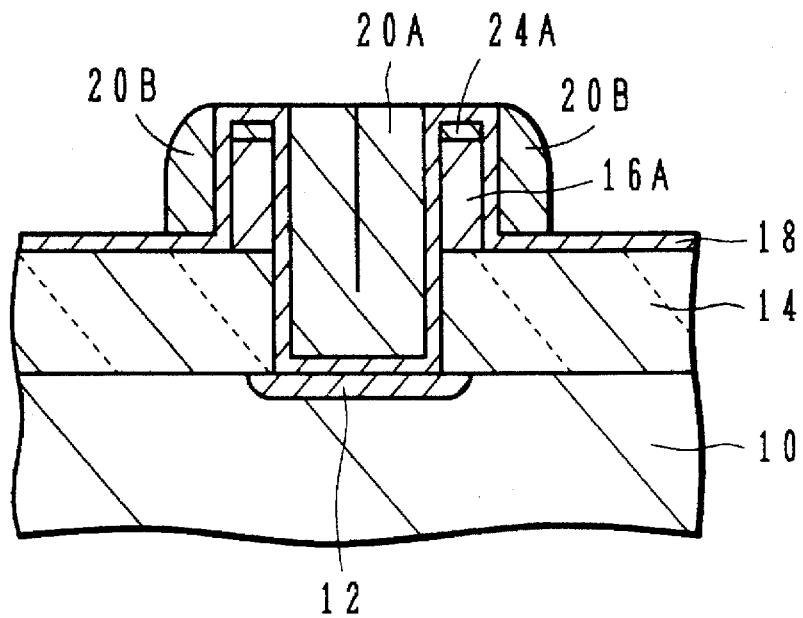

As shown in FIG. 13, similar to the process illustrated in FIG. 6, a blanket W layer 20 is formed on the TiN layer 18, burying the contact hole CH. Thereafter, as shown in FIGS. 14 and 15, a connection layer 22 is formed by anisotropically dry-etching the W layer 20 and TiN layer 18, similar to the processes illustrated in FIGS. 7, 8A and 8B.

In the embodiment shown in FIGS. 10 to 15, the upper surface of the remaining portion 16A of the Al alloy layer 16 is covered with the remaining portion 24A of the TiN layer 24. The number of processes for forming such an interconnection layer is equal to that of the conventional technique illustrated in FIGS. 16 to 20.

Since an antireflection layer such as TiN layer 24 is formed, a precision of transferring a pattern to a resist layer during a photolithography process illustrated in FIGS. 10 and 11 can be improved. At the interconnection patterning process illustrated in FIG. 11, since the two layers of Ti alloy and Al alloy are etched, corrosion is hard to be generated after etching, as compared to etching three layers of Ti alloy, Al alloy, and Ti alloy.

Figure 15:
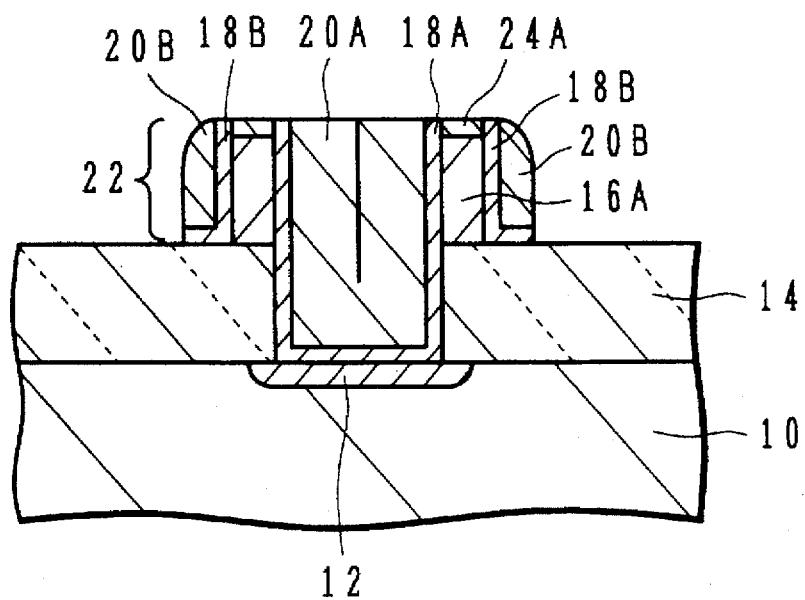
Figure 16:
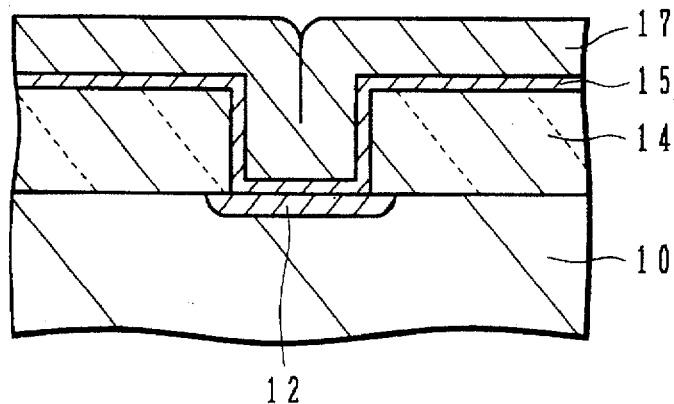
FIGS. 16 to 20 are cross sectional views of a substrate illustrating main processes of forming an interconnection according to a conventional interconnection forming method.
Figure 17:
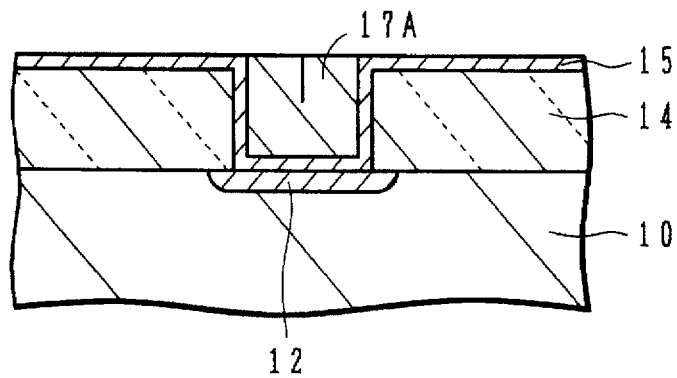
Figure 18:
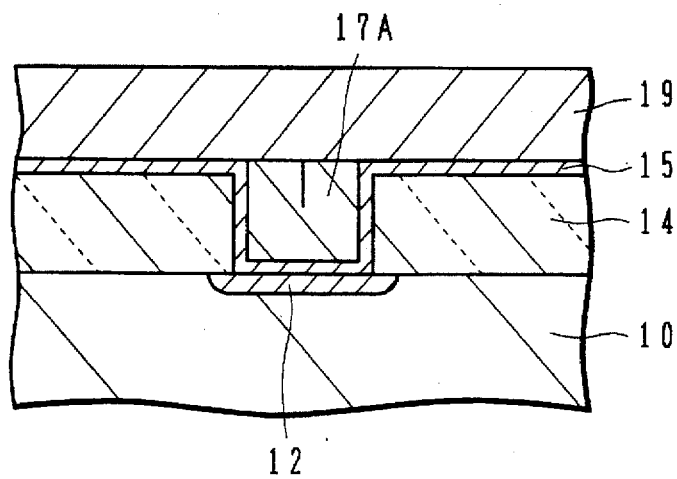
Figure 19:
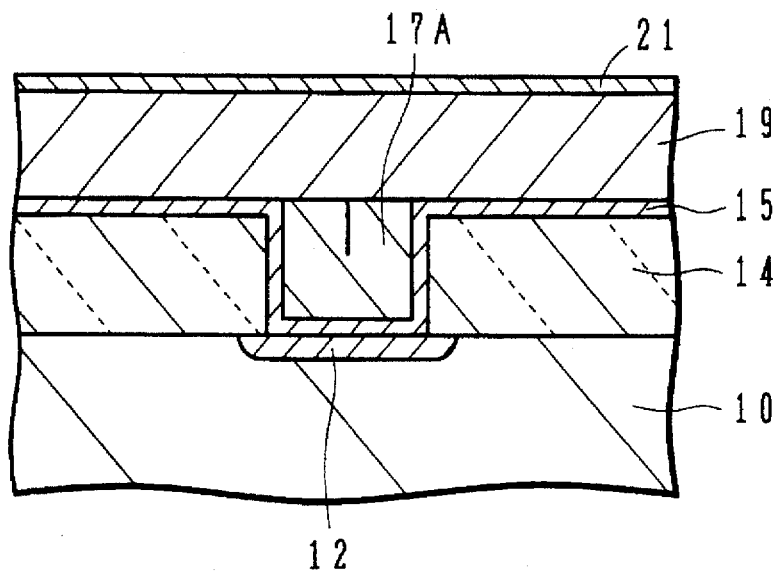
Figure 20:
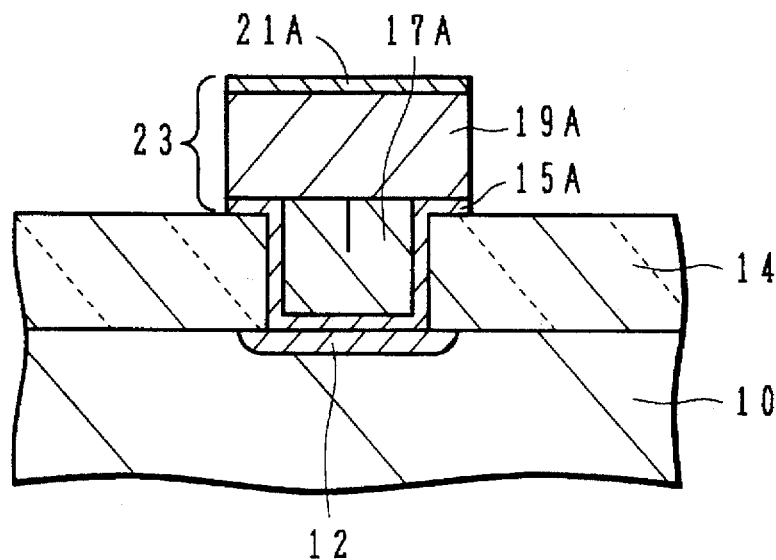

The interconnection structure show in FIG. 15 provides the operation and effect similar to the structure shown in FIG. 8. In addition, since the upper surface of the remaining portion 16A of the Al alloy layer 16 is covered with the remaining portion 24A of the TiN layer 24, the generation of hillocks can be suppressed further.

In FIG. 9B, the interconnection layers 22A and 22B formed in a manner similar to the one for forming the interconnection layer 22 shown in FIG. 15 are different from an interconnection formed in a manner similar to the interconnection layer shown in FIG. 8, only in that the upper surfaces of the remaining portions 16A and 16B of the Al alloy layer 16 are covered with the remaining portions 24A and 24B of the TiN layer 24. Therefore, even in the case of an interconnection layer formed in a manner similar to the one for forming the interconnection layer 22 shown in FIG. 15, step coverage can be improved when the interconnection layer is covered with an insulating film.

Figure 21:
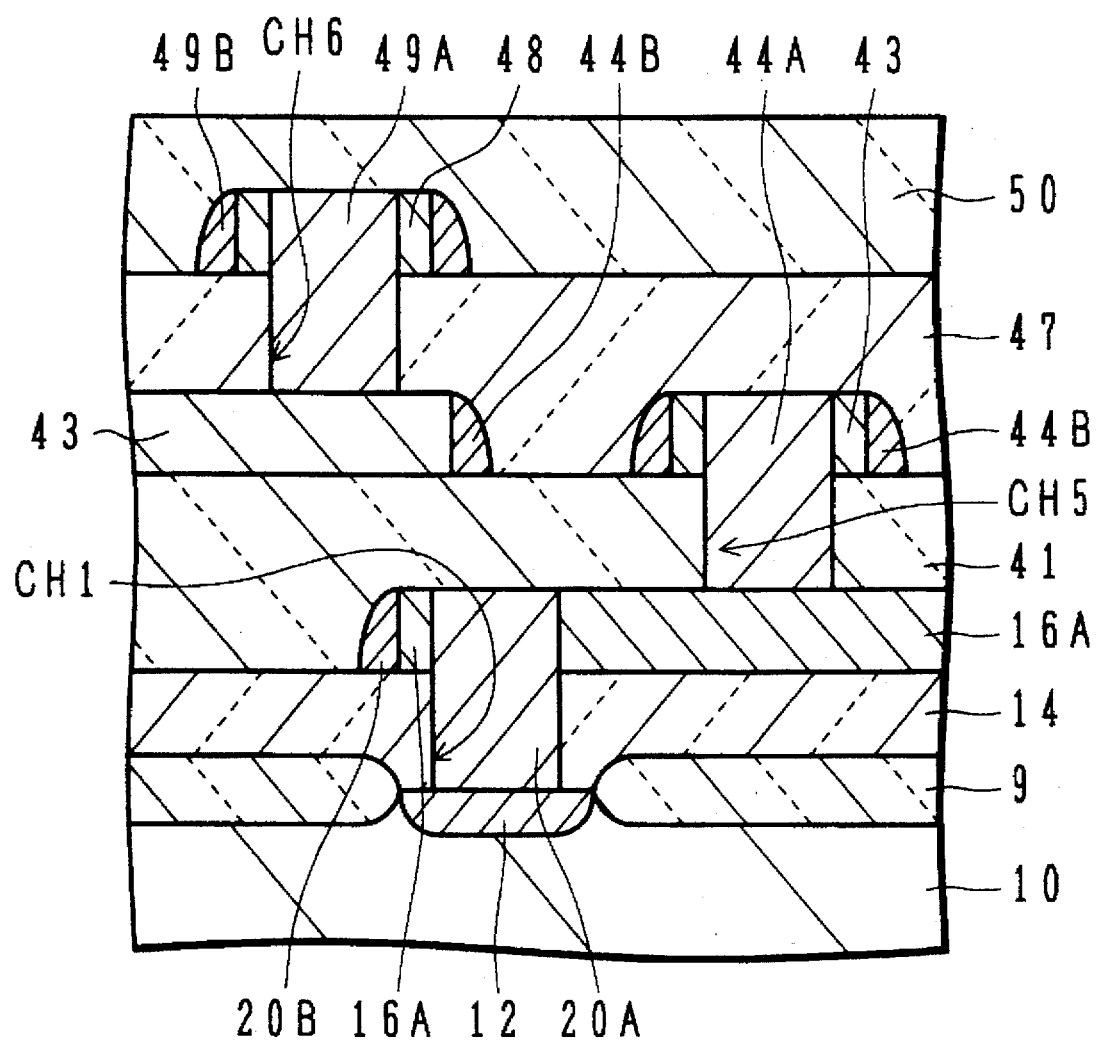
FIG. 21 is a cross sectional view of a multi-layer interconnection structure according to another embodiment of this invention.

FIG. 21 shows an example of the structure of multilayer interconnections. For the purpose of simplicity, an adhesion layer and an antireflection layer are not shown. They may be formed, if necessary, similar to the above embodiments. An $n^+$-type region 12 is formed in an active region defined by a field oxide film 9 on the surface of a p-type Si substrate. A first interlayer insulating film 14 is formed, covering the field oxide film 9 and $n^+$-type region 12. A contact hole CH1 is formed, reaching the $n^+$-type region 12. A first interconnection 16A such as Al alloy is formed on the first interlayer insulating film 14, the first interconnection 16A having a via hole with the same shape as the contact hole. A metal plug 20A such as W is buried in the contact hole, and a step relieving part 20B made of the same material as the metal plug is formed on the side walls of the first interconnection 16A. This interconnection structure corresponds to the above embodiments. A second interlayer insulating film 41 is formed on the first interconnection 16A.

A connection hole CH5 is formed in the second interlayer insulating film 41. A second interconnection 43 is formed on the second interlayer insulting film 41. Similar to the first interconnection, a metal plug 44A is buried in the connection hole CH5, and a step relieving part 44B is formed around the peripheral area of the second interconnection 43 by the same material as the metal plug 44A. The second interconnection 43 is covered with a third interlayer insulating film 47.

A third interconnection 48 is formed on the third interlayer insulting film 47. A connection hole CH6 formed through the third interlayer insulating film 47 is buried with a metal plug 49A, and a step relieving part 49B is formed around the peripheral area of the third interconnection 48. A passivation film 50 is formed, covering the third interconnection 48.

In this embodiment, although every interconnection has the metal plug and step relieving part, this structure may be applied to only some limited interconnections.

The present invention has been described in connection with the preferred embodiments. The invention is not limited only to the above embodiments, but it is apparent to those skilled in the art that various modifications, improvements, combinations and the like can be made without departing from the scope of the appended claims.

I claim:

1. A method of forming an interconnection, comprising the steps of:

forming an insulating film covering a surface of a substrate having a region to be connected to an interconnection;

forming an interconnection layer on said insulating film;

forming a connection hole through a laminate of said interconnection layer and said insulating film, said connection hole exposing said connection region;

patterning said interconnection layer to have a desired interconnection pattern and leave a portion of said interconnection layer on said insulating film at least at a peripheral area around said connection hole;

forming a conductive adhesion layer on said insulating film, said adhesion layer covering said left portion of said interconnection layer and the inner surface of said connection hole; and forming a conductive layer burying said connection hole and etching back said conductive layer, wherein a portion of said conductive layer is left on an outer side wall of said portion of said interconnection layer left on said insulating film at a peripheral area around said connection hole, so as to relieve a step of said left portion of said interconnection layer.

2. The method according to claim 1, wherein said interconnection pattern has a connection hole having an inner side wall flush with an inner side wall of the connection hole in said insulating film.

3. The method according to claim 2, wherein said interconnection pattern has a looped shape around said connection hole.

4. The method according to claim 1, wherein said interconnection layer is formed of a material selected from the group consisting of Al, Al alloy, W, Mo, Ti, Ta, silicides of W, Mo, Ti and Ta, and Cu.

5. The method according to claim 1, wherein at least one of said steps of a connection hole and of patterning said interconnection layer is carried out by inductively coupled plasma etching.

6. The method according to claim 1, wherein said interconnection layer is formed of Al or Al alloy, and said step of forming a connection hole is carried out using a chlorine containing gas and a fluorine containing gas.

7. The method according to claim 6, wherein said conductive adhesion layer is formed of a material selected from the group consisting of TiN, TiON, TiW and WSi.

8. The method according to claim 6, wherein said conductive layer is formed by CVD.

9. The method according to claim 8, wherein said conductive layer is a tungsten layer.

10. The method according to claim 9, wherein said step of etching back said conductive layer is carried out by anisotropic etching using a chlorine containing gas or a fluorine containing gas.

11. The method according to claim 10, further comprising the step of etching said conductive adhesion layer with a chlorine containing gas.

12. A method of forming an interconnection, comprising the steps of:

forming an insulating film covering a surface of a substrate having a region to be connected to an interconnection;

forming an interconnection layer on said insulating film;

forming an antireflection layer on said interconnection layer;

forming a connection hole through a laminate of said antireflection layer, said interconnection layer, and said insulating film, by photolithography and selective etching, said connection hole exposing said connection region;

patterning a laminate of said interconnection layer and said antireflection layer to leave a portion of said laminate on said insulating film at least at a peripheral area around said connection hole, by photolithography and selective etching;

forming a conductive adhesion layer on said insulating film, said adhesion layer covering said left portion of said laminate and the inner surface of said connection hole; and forming a conductive layer burying said connection hole and etching back said conductive layer, wherein a portion of said conductive layer is left on an outer side wall of said portion of said laminate left on said insulating film at a peripheral area around said connection hole, so as to relieve a step of said left portion of said laminate.

13. The method according to claim 12, wherein said step of forming a conductive layer and etching back said conductive layer comprises forming a conformal conductive layer by CVD and etching back said conductive layer by anisotropic etching.

14. The method according to claim 13, further comprising the step of etching back said conductive adhesion layer by anisotropic etching.

15. The method according to claim 13, wherein said conductive layer is a tungsten layer.

* * * * *